United States Patent [19]

Shibata et al.

[11] Patent Number: 5,469,085
[45] Date of Patent: Nov. 21, 1995

[54] SOURCE FOLLOWER USING TWO PAIRS OF NMOS AND PMOS TRANSISTORS

[76] Inventors: Tadashi Shibata, 5-2, Nihondaira, Taihaku-ku; Tadahiro Ohmi, 1-17-301, Komegabukuro 2-chome, Aoba-ku, both of Sendai-shi Miyagi-ken 980, Japan

[21] Appl. No.: 87,675

[22] PCT Filed: Jan. 13, 1992

[86] PCT No.: PCT/JP92/00019

§ 371 Date: Oct. 13, 1993

§ 102(e) Date: Oct. 13, 1993

[87] PCT Pub. No.: WO92/12575

PCT Pub. Date: Jul. 23, 1992

[30] Foreign Application Priority Data

| Jan. 12, 1991 | [JP] | Japan | 3-013780 |
| Jul. 2, 1991 | [JP] | Japan | 3-188147 |

[51] Int. Cl.⁶ .................................. H03K 19/0948
[52] U.S. Cl. .................. 326/121; 326/36; 326/50
[58] Field of Search .................. 307/443, 451, 307/475, 576, 448; 326/121, 34, 36, 85, 136, 50

[56] References Cited

U.S. PATENT DOCUMENTS

| 4,652,773 | 3/1987 | Cartwright, Jr. | 307/451 |
| 4,654,548 | 3/1987 | Tanizawa et al. | 307/451 |
| 4,727,266 | 2/1988 | Fujii et al. | 307/448 |
| 5,036,223 | 7/1991 | Sakai et al. | 307/448 |
| 5,059,835 | 10/1991 | Lauffer et al. | 307/475 |
| 5,095,230 | 3/1992 | Takai et al. | 307/451 |
| 5,192,879 | 3/1993 | Aoki et al. | 307/448 |
| 5,206,544 | 4/1993 | Chen et al. | 307/451 |
| 5,258,657 | 11/1993 | Shibata et al. | 326/35 |

FOREIGN PATENT DOCUMENTS

| 52-133747 | 9/1977 | Japan . | |
| 53-103371 | 9/1978 | Japan | 307/451 |
| 56-19660 | 2/1981 | Japan . | |
| 57-190423 | 11/1982 | Japan . | |
| 59-221678 | 12/1984 | Japan . | |
| 1-137821 | 5/1989 | Japan . | |
| 1-125952 | 5/1989 | Japan . | |
| 1-268313 | 10/1989 | Japan . | |
| WO90/15444 | 12/1990 | Japan . | |

*Primary Examiner*—David R. Hudspeth
*Assistant Examiner*—Benjamin D. Driscoll
*Attorney, Agent, or Firm*—Baker & Daniels

[57] ABSTRACT

A source follower circuit which operates at high speed and maintains low power consumption and which includes a pair of small, normally on, NMOS and PMOS transistors and a pair of large, normally off, NMOS and PMOS transistors. The two pairs of transistors are connected in parallel. In each pair of transistors the sources and the gates of the NMOS and PMOS transistors are connected to each other. Furthermore, the threshold voltages of the transistors must be set so that: large NMOS transistor voltage>small PMOS transistor voltage>small NMOS transistor voltage>large PMOS transistor voltage, or so that small PMOS transistor voltage>large NMOS transistor voltage>large PMOS transistor voltage>small NMOS transistor voltage.

2 Claims, 8 Drawing Sheets

(a)

(b)

(c)

5,469,085

SOURCE FOLLOWER USING TWO PAIRS OF NMOS AND PMOS TRANSISTORS

TECHNICAL FIELD

The present invention relates to a semiconductor device, and in particular to a high performance CMOS circuit.

BACKGROUND ART

Conventionally, source-follower circuits were widely used as circuits for the efficient driving of low impedance loads. Such a conventional circuit is depicted in FIG. 10. This diagram indicates a source-follower circuit comprising 1 NMOS transistor 1001 and a load resistance ($R_L$) 1002; the drive load 1003 is assumed to be $C_{out}$. If the resistance during the ON state of the NMOS transistor is assumed to be $R_{ON}$, then $V_{out}$ is calculated according to the following formula:

$$V_{OUT} = \frac{R_L}{R_{ON}+R_L} V_{DD} \quad (1)$$

Herein, $R_{ON}$ is a resistance determined by the gate source differential voltage $V_{GS}$ (=$V_{in}-V_{out}$). $R_L$ is set to a sufficiently high value, and when $R_L \gg R_{ON}$, formula (1) is simplified to $V_{out}=V_{DD}$; however, in actuality, when Vout approaches $V_{in}$, and the state shown in the formula:

$$V_{GS}=V_{in}-V_{out}\sim V_T$$

($V_T$ indicates the threshold value of the NMOS transistor) is reached, the NMOS transistor changes to the OFF state, so that $R_{ON}$ rapidly reaches a high value. That is to say, the situation is as shown in the following formula:

$$V_{in}-V_{out}\sim V_T,$$

that is to say $$V_{out}=V_{in}-V_T \quad (1)$$

is reached, and the output settles at a certain value. Even if $V_T$ is set equal to 0, $V_{out}$ will be equal to $V_{in}$, and the transistor acts as a linear amplifier of voltage gain 1. In order to rapidly charge a large load capacitance $C_{out}$, it is preferable to obtain a sufficiently large W/L of the transistor. (W indicates channel width, while L indicates channel length)

At this time, the gate capacitance of the MOS transistor is Cox·L·W, and increases in proportion to the product of L and W. (Cox indicates the capacitance with respect to a surface area unit of the gate.) However, the voltage placed on both ends of the gate oxide film is essentially 0, so that the charge stored in this gate capacitance is, in actuality, 0, and accordingly, the effective input capacitance of the circuit of FIG. 10 seen from $V_{in}$ is essentially 0. That is to say, even if a large load capacitance (low impedance load) is carried on the output side of the circuit of FIG. 10, only a very small capacitance is apparent from the input side (the $V_{in}$ side) (high input impedance), so that such a circuit type has been widely known as an impedance conversion circuit. Such a circuit is extremely convenient for driving a large capacitance.

The threshold value of the NMOS transistor is set to $V_T=0$, and when a fixed positive voltage $V_{in}$ is inputted into the circuit of FIG. 10, a fixed potential output $V_{out}=V_{in}$ is maintained.

When this done, a current $$I_N=V_{out}/R_L \quad (2)$$

is caused to flow in this circuit, and power equalling $V_{out}^2/R_L$ is consumed. In order to reduce this consumption current, $R_L$ must be increased. Here, if the input voltage changes from the positive fixed value $V_{in}$ to 0, then the change in $V_{out}$ at this time is approximately as shown in FIG. 11; it decreases at time constant $R_L \cdot C_{out}$, and approaches 0. That is to say, the time period in which the output level conforms to the input and changes to the low potential side shortens in proportion to $R_L$. That is to say, in order to increase the speed of the circuit, it is preferable that the $R_L$ be as small as possible.

However, when $R_L$ is reduced, as is clear from formula (2), the current value at the time at which the fixed voltage is maintained is increased, and the consumption current increases. Moreover, as can be understood from formula (1), the level of $V_{out}$ is lowered, and at $R_{ON} \gg R_L$, $V_{out}$ is approximately equal to 0. That is to say, the effect of this is to reduce the voltage gain of the amplifier of FIG. 10 in a striking manner.

The present invention was created in order to solve the problems stated above; it has as an object thereof to provide a semiconductor device which makes possible almost zero steady state consumption power of the source-follower circuit, is moreover capable of being operated at high speed, and is further accompanied by no reduction at all in voltage gain.

DISCLOSURE OF THE INVENTION

The present invention discloses a semiconductor device comprising plural n-channel MOS transistors, and p-channel MOS transistors, wherein the sources of a first n-channel MOS transistor and a first p-channel MOS transistor are connected, the gate electrode of this first n-channel MOS transistor and the gate electrode of the first p-channel MOS transistor are connected, and the drain of the first n-channel MOS transistor has a higher electric potential than the drain of the first p-channel MOS transistor.

By means of the above semiconductor device, a source follower circuit can be realized which has a voltage gain which is essentially equal to 1, and it is possible to reduce the consumption of power during the maintenance of a fixed potential to essentially 0. Furthermore, a circuit can be realized which responds at exceedingly high speed to changes in potential.

BEST MODE FOR CARRYING OUT THE INVENTION

Hereinbelow, the present invention will be explained in detail based on embodiments; however, the present invention is of course not limited to these embodiments.

(Embodiment 1)

Figure 1:
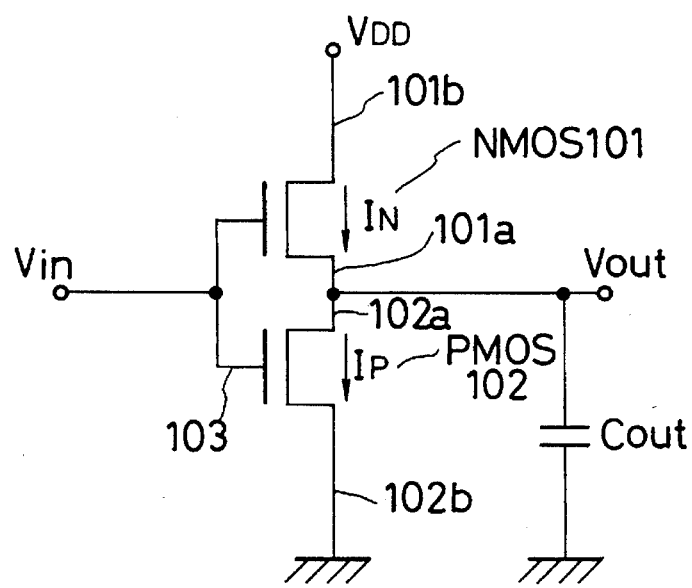
FIG. 1 is a conceptual diagram showing the circuit of Embodiment 1.

A first embodiment of the present invention is depicted in FIG. 1. In the diagram, an NMOS transistor 101 (abbreviated as "NMOS"), a PMOS transistor 102 (abbreviated as "PMOS"), sources 101a and 102a, drains 101b and 102b, and gate 103 are depicted.

In general, in MOS type transistors, the electrode from which the carrier flows is termed "the source", while the electrode into which the carrier flows is termed "the drain". Accordingly, in the NMOS, the low potential side from which electrons flow is the source, while the high potential side is termed the drain. Furthermore, in the PMOS, the high potential side from which the hole flows out is the source, while the low potential side is the drain. Furthermore, the threshold voltages of the NMOS and PMOS have the values of $V_{TN}$ and $V_{TP}$, respectively, and in the present example, conditions are set such that $$V_{TN} < V_{TP} \quad (3).$$

If the current flowing through NMOS 101 and PMOS 102 is termed $I_N$ and $I_P$, respectively, and both transistors are operated in a saturation region, $$I_N = (1/2) \cdot \beta_N (V_{GS} - V_{TN})^2 \quad (4), \text{ and}$$

$$I_P = (1/2) \cdot \beta_P (V_{GS} - V_{TP})^2 \quad (5).$$

Herein $$\beta_N = (W/L)_N \mu_N C_{ox}$$

$$\beta_P = (W/L)_P \mu_P C_{ox}$$

$(W/L)_N$: ratio of the channel width W and the channel length L of the NMOS.

$(W/L)_P$: ratio of the channel width W and the channel length L of the PMOS.

$\mu_N$: channel mobility of the electron $\mu_P$: channel mobility of the hole.

Figure 2:
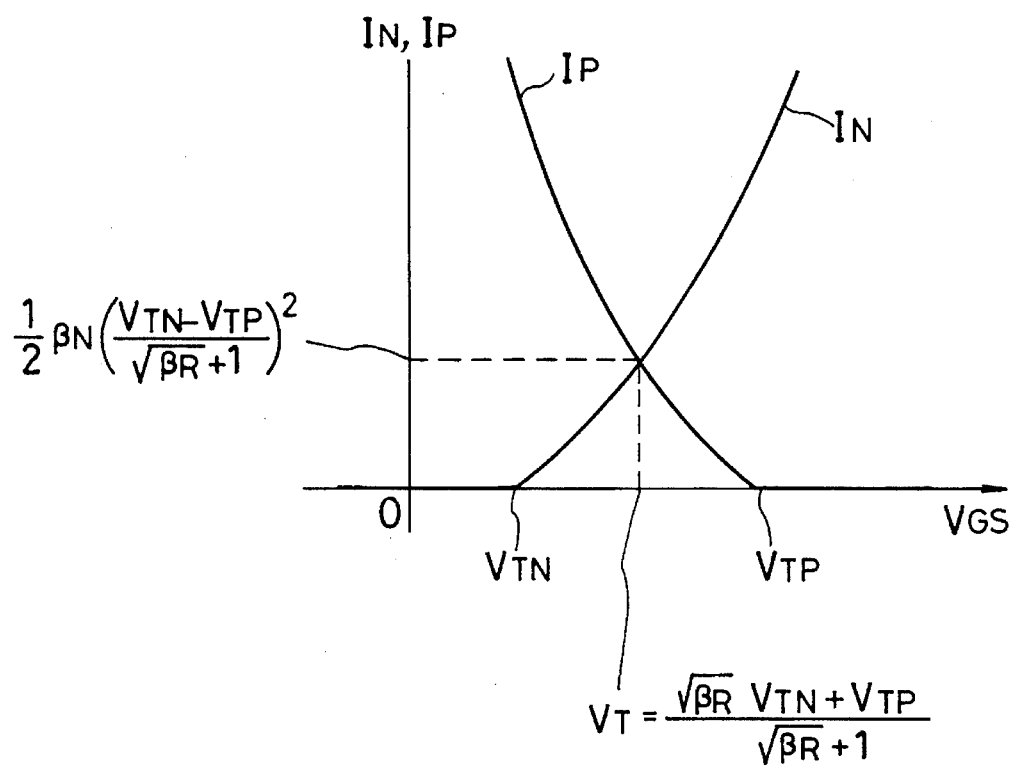
FIG. 2 is a graph showing the relationship between current flowing through the circuit of Embodiment 1 and $V_{GS}$.

FIG. 2 illustrates the relationship between $I_N$ and $I_P$, and $V_{GS}$; when a fixed voltage is inputted into $V_{in}$, the circuit is stable under conditions such that $I_N = I_P$. That is to say, at this time, $$V_{GS} = V_{in} - V_{out} = V_T.$$

From the diagram, $V_T$ is given by the following formula:

$$V_T = \frac{\sqrt{\beta_R} \, V_{TN} + V_{TP}}{\sqrt{\beta_R} + 1}. \quad (6)$$

The condition $V_{TN} < V_{TP}$ of formula (3) is a necessary and sufficient condition so that the $I_N$ and $I_P$ curves of FIG. 2 will have a crossing point.

Accordingly, $V_{out}$ is such that $$V_{out} = V_{in} - V_T \quad (7).$$

This corresponds to the (1') of the conventional example. That is to say, an amplifier having a voltage gain of 1 is realized.

Now, $V_{in}$ is assumed to have changed to a low potential. That is to say, if $$V_{out} > V_{in} - V_T,$$

then $$V_{GS} = V_{in} - V_{out} < V_T.$$

At this time, as is clear from FIG. 2, a larger current flows in the PMOS, and the current flowing in the NMOS is reduced. In particular, when $V_{GS} < V_{TN}$, the NMOS is cut off, so that absolutely no current flows therein. In this manner, the charge stored in $C_{out}$ is discharged rapidly by the PMOS, $V_{out}$ follows the changes of $V_{in}$, and the circuit settles again when $V_{out} = V_{in} - V_T$.

On the other hand, when $V_{in}$ changes to the high potential side, and $V_{out} < V_{in} - V_T$, then $V_{GS} = V_{in} - V_{out} > V_T$, and this time, the PMOS changes to the OFF state, a large current flows in the NMOS, and $C_{out}$ is rapidly charged, so that $V_{out}$ is increased, and the circuit settles at the point at which $V_{out} = V_{in} - V_T$.

In the above manner, the charging and discharging of $C_{out}$ is conducted by means of the ON state of the NMOS transistor and the PMOS transistor, respectively, so that high speed charging and discharging is possible, and it is possible to respond to an input signal which changes at high speed. In particular, if $\beta_N$ is set equal to $\beta_P$, the current driving ability of the NMOS and the PMOS becomes equal, the speed of charge and discharge becomes equal, and this is particularly advantageous for an increase in the circuit speed.

This is an important characteristic which is not found in conventional examples. In conventional examples, the charging period of $C_{out}$ is determined by $R_L \cdot C_{out}$, and insofar as $R_L$ is not reduced, it is impossible to reduce the charging time. However, if $R_L$ is reduced, the voltage gain is reduced, and the consumption of power increases in inverse proportion to $R_L$.

In the present invention, it is possible to shorten the charge and discharge time by any desired amount by means of increasing the $\beta_N$ and $\beta_P$ of the transistors. Moreover, even if the values of $\beta_N$ and $\beta_P$ are large, the voltage gain remains at a value of 1, and is not reduced. Moreover, as for the consumption of power, from FIG. 2, the current flowing in the steady state is $$I = (1/2) \cdot \beta_N (V_{TN} - V_{TP})/(\sqrt{\beta_R} + 1)\}^2 \quad (8)$$

so that it is possible to reduce the current I by as much as desired by setting the values of $V_{TN}$ and $V_{TP}$ to nearly equal values, and it is thus possible to set the consumption power to a fixed small value or to essentially 0, irrespective of circuit operating speed.

As stated above, by means of the circuit of the present invention, it is possible to solve all problems which were present in conventional source follower circuits. Furthermore, the value of $V_T$ is in accordance with formula (6); the values of $V_{TN}$, $V_{TP}$, and $\beta_R$ can be appropriately set so as to set the value of $V_T$ to 0. For example, if $\beta_R=1$, $V_{TN}=-1$ V, and $V_{TP}=1$ V, then $V_{out}=V_{in}$, and it is possible to obtain a value at the output side which is equivalent to the input voltage. Furthermore, in order to set $V_T=0$, it is of course possible to combine other values of $V_{TN}$, $V_{TP}$, and $\beta_R$.

(Embodiment 2)

In Embodiment 1, the threshold value $V_{TN}$ of the NMOS, and the threshold value $V_{TP}$ of the PMOS shown in FIG. 1 were such that $V_{TN}<V_{TP}$; however, it is also possible to set this so that $V_{TN}=V_{TP}$.

By doing this, it is possible to set the consumption power from formula (8) to 0.

(Embodiment 3)

In the circuit shown in FIG. 1, it is possible to set the threshold value $V_{TN}$ of the NMOS and the threshold value of $V_{TP}$ of the PMOS so that $$V_{TP}<V_{TN} \tag{9}$$

Figure 3:
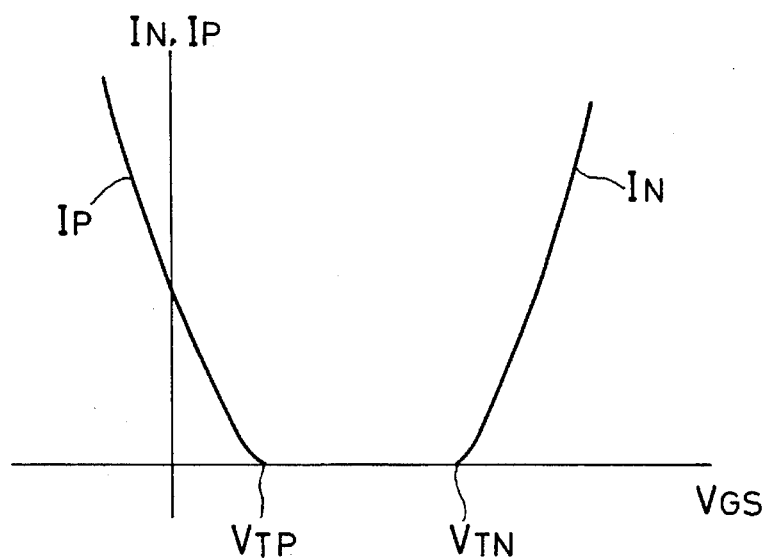
FIG. 3 is a graph showing the relationship between the current flowing through the circuit of Embodiment 3 and $V_{GS}$.

In this case, as shown in FIG. 3, the characteristics of $I_N$ and $I_P$ are such that they do not have a point of intersection, so that $V_{GS}$ may have a freely selected value within a range such that $$V_{TP}<V_{GS}<V_{TN}.$$

That is to say, $V_{out}$ will settle at some value within a range such that $$V_{in}-V_{TN}<V_{out}<V_{in}-V_{TP} \tag{10};$$

however, there is no guarantee that this will be a fixed value. That is to say, the value will be uncertain within the above range. From the point of view of circuit operation, it is permissible to adopt the conditions of formula (10), so long as the uncertainty of the value is permissible within the prescribed range. In such a case, the amount of current flowing in the steady state reaches 0, so that it is possible to realize a circuit having low consumption power.

Furthermore, if $V_{TP}$ is approximately equal to $V_{TN}$ while fulfilling the condition that $V_{TP}<V_{TN}$, it is possible to sufficiently minimize the uncertainty of the value of $V_{out}$ expressed in formula (10).

(Embodiment 4)

Figure 4:
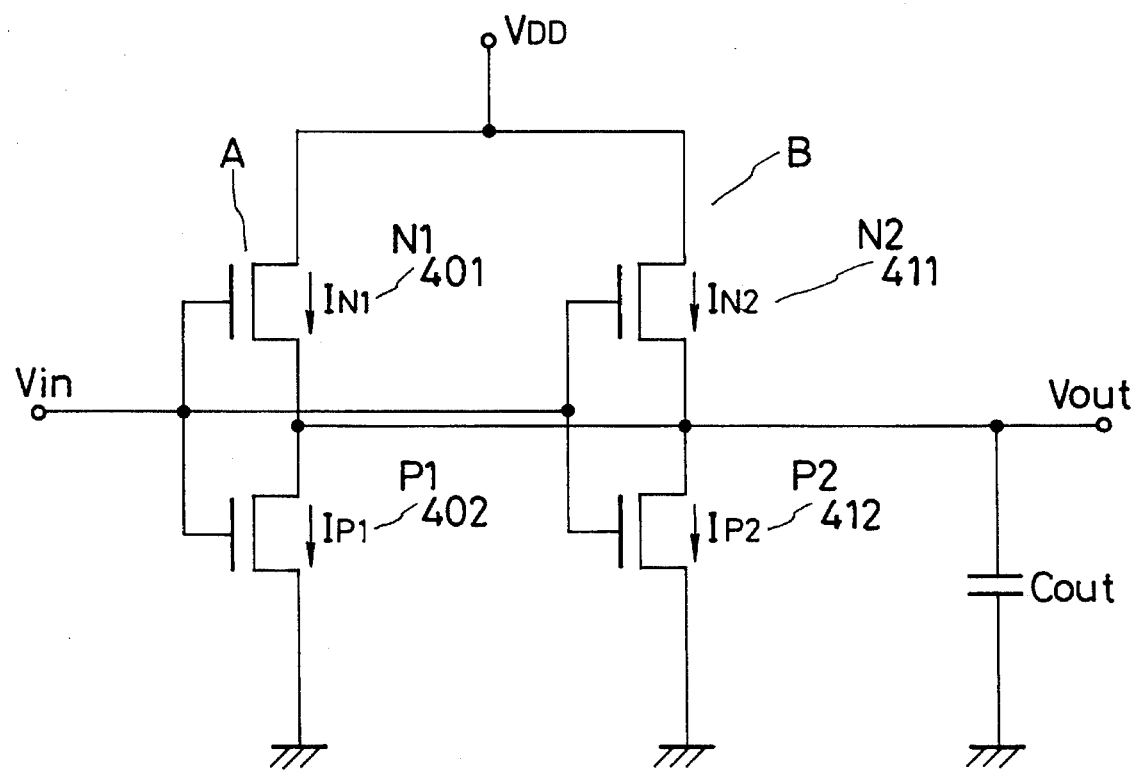
FIG. 4 is a conceptual diagram showing the circuit of Embodiment 4.

A fourth Embodiment of the present invention is depicted in FIG. 4. In the present Embodiment, two circuits having a structure identical to that of Embodiment 1 (an A circuit and B circuit) are connected in parallel and form a circuit having a structure such that the inputs and outputs thereof are respectively connected.

The parameters of each transistor of FIG. 4 are defined as given below.

| | Threshold value | Channel length | Channel width |
|---|---|---|---|
| $N_1$ | $V_{TN1}$ | $L_{N1}$ | $W_{N1}$ |
| $P_1$ | $V_{TP1}$ | $L_{P1}$ | $W_{P1}$ |
| $N_2$ | $V_{TN2}$ | $L_{N2}$ | $W_{N2}$ |
| $P_2$ | $V_{TP2}$ | $L_{P2}$ | $W_{P2}$ |

In the present Embodiment, the threshold value is set in the following manner.

$$V_{TP2}<V_{TN1}<V_{TP1}<V_{TN2}$$

Furthermore, the W/L which indicates the current driving ability of the transistor, is such that $$W_{N1}/L_{N1}<<W_{N2}/L_{N2}$$

$$W_{P1}/L_{P1}<<W_{P2}/L_{P2}.$$

That is to say, the $N_2$ and $P_2$ transistors are set so as to possess a sufficiently large current driving ability in comparison with the $N_1$ and $P_1$ transistors.

In this circuit, component circuits A and B have inputs and outputs which are respectively connected, so that $$V_{GS1}=V_{GS2}.$$

Figure 5:
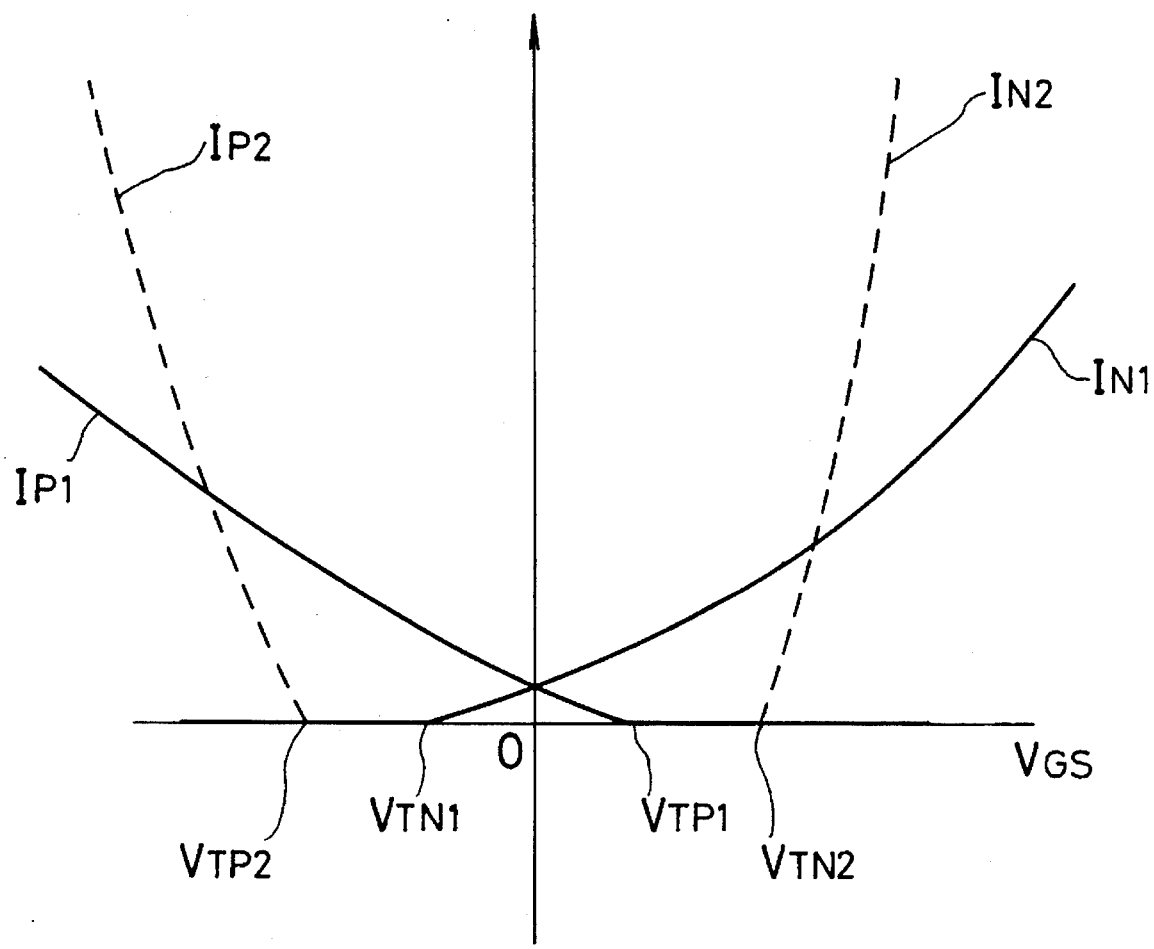
FIG. 5 is a graph showing the relationship between current flowing through the circuit of Embodiment 4 and $V_{GS}$.

If the function of $V_{GS}$ is used and the currents flowing in the respective transistors are expressed, the graph shown in FIG. 5 will result.

The respective component circuits are set so that $\beta_R=1$. Furthermore, setting is conducted so that $V_{TP1}=|V_{TN1}|$, and from formula (6), $V_T=0$; that is to say, $V_{out}=V_{in}$.

When this circuit maintains a fixed output voltage such that $V_{out}=V_{in}$ (that is to say, when $V_{GS}=0$), no current flows in circuit B. The reason for this is that, as is clear from FIG. 5, when $V_{GS}=0$, both transistors $N_2$ and $P_2$ are placed in an OFF state. On the other hand, transistors $N_1$ and $P_1$ are both in an ON state, so that from formula (8), $$I=(\tfrac{1}{2})\cdot\beta_{N1}\{(V_{TN1}-V_{TP1})/2\}^2$$

Here, if $|V_{TN1}|=V_{TP1}$ is designated, then $$I=(\tfrac{1}{2})\cdot\beta_{N1}V_{TN1}^2 \tag{11}$$

results, and a current I flows in the circuit. Here, $\beta_{N1}$ represents the B of transistor $N_1$, and $$\mu_{N1}=\mu_N C_{ox} W_{N1}/L_{N1}.$$

From formula (11), by means of sufficiently reducing $\beta_{N1}$ and $V_{TN1}$, it is possible to reduce the steady state consumption current by any desired amount. Moreover, the $V_{TN1}<V_{TP1}$ relationship is maintained, so that the uncertainty present in the output voltage in accordance with formula (10) is not present.

Figure 6:
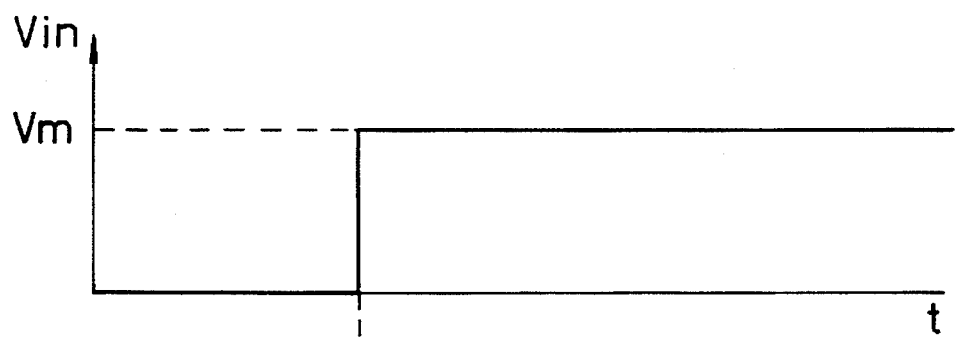
FIG. 6 is a graph showing the response characteristics of the output voltage in the circuit of Embodiment 4.
Figure 6:
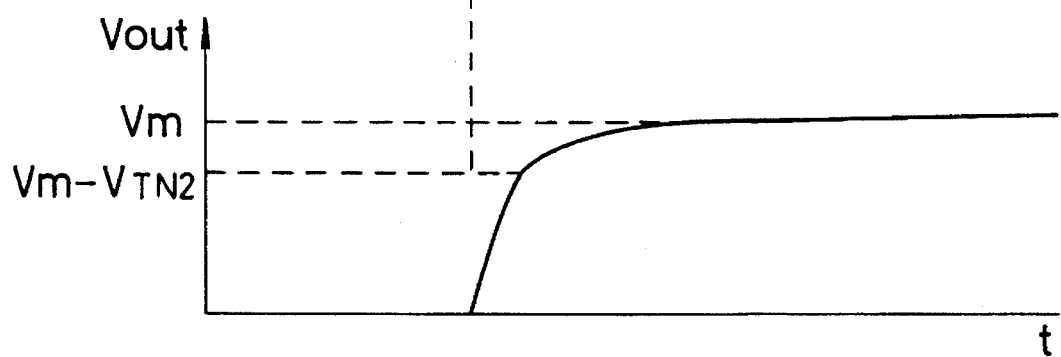
Figure 6:
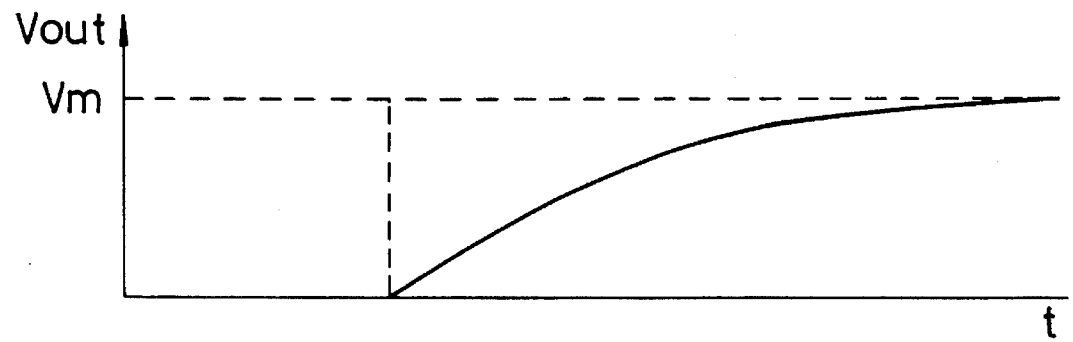

Now, if $V_{in}$ is altered, so that $V_{GS}=V_{in}-V_{out}>V_{TN2}$, transistor $N_2$ will be placed in an ON state simultaneously with transistor $N_1$. In comparison with transistor $N_1$, transistor $N_2$ is such that $W_{N1}/L_{N1}<<W_{N2}/L_{N2}$, so that, as shown in FIG. 4, a sufficiently large current flows, and change is effected so that $V_{out}=V_{in}-V_{TN2}$ in an extremely short time. After this, only $N_1$ is placed in an ON state, so that change occurs slowly, so that $V_{out}=V_{in}$. The state of this change is shown in FIG. 6(b). FIG. 6(c) shows the following characteristics in the case of solely the component circuit A, and it can be seen that by means of the addition of circuit B, a further increase in circuit speed can be achieved.

When change occurs so that $V_{in}$ becomes smaller, in the same manner, when $V_{GS}=V_{in}-V_{out}<V_{TP2}$, $P_2$ is placed in an ON state and a large charging current flows, so that $V_{out}$ changes rapidly.

In the present Embodiment, $V_{out}$ follows the changes of $V_{in}$ promptly, so that an NMOS ($N_2$) and a PMOS ($P_2$) having a large current driving ability are prepared, and by means of these, charge and discharge are accomplished swiftly; however, a fixed level is maintained, so that the current which flows is determined by the transistors ($N_1$ and $P_1$) having a small current driving ability, so that it is possible to maintain a small steady state consumption power. Such a circuit is particularly advantageous in the case in which a large capacitance load is driven.

(Embodiment 5)

In Embodiment 4, the threshold values of each transistor shown in FIG. 4 were set so as to satisfy the conditions that $V_{TP2}<V_{TN1}<V_{TP1}<V_{TN2}$; however, it is also possible to set these values such that $$V_{TN1}<V_{TP2}<V_{TN2}<V_{TP1}.$$

Figure 7:
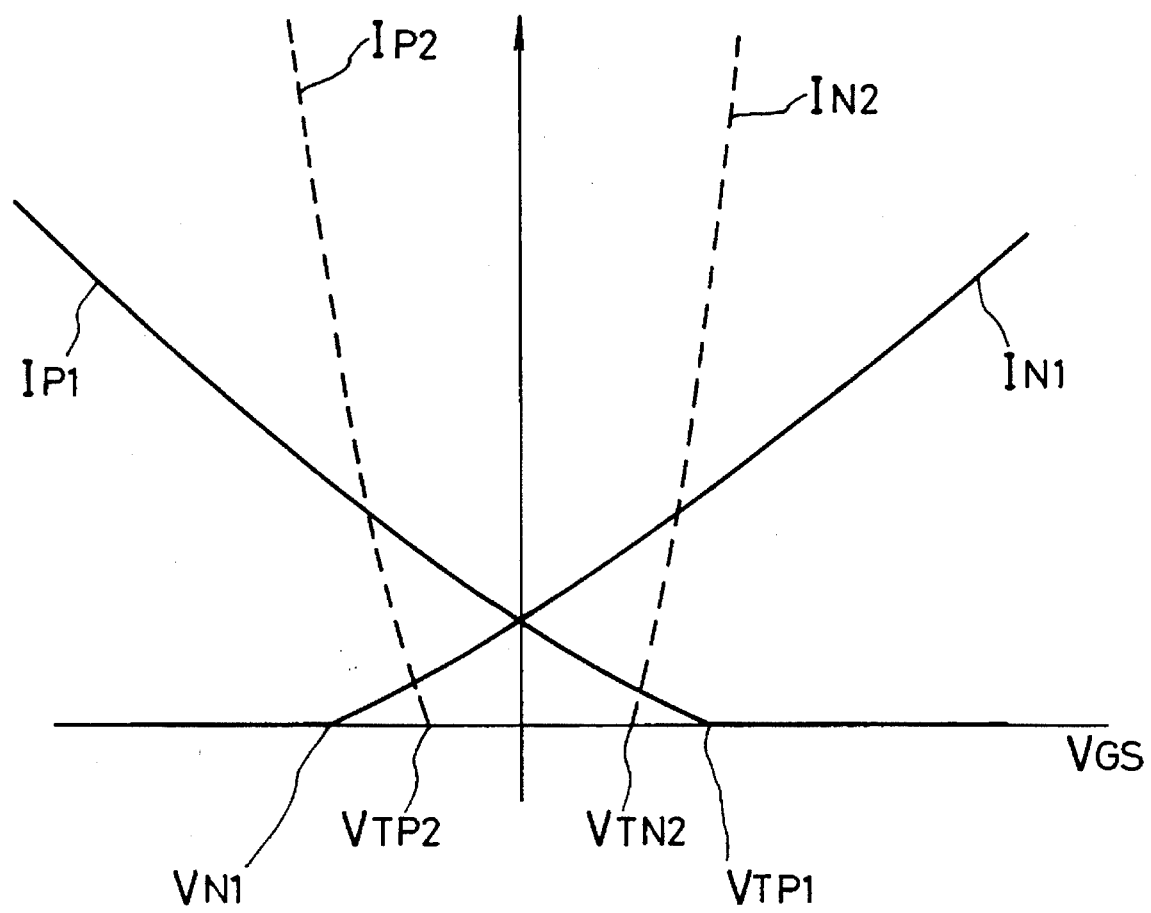
FIG. 7 is a graph showing the relationship between current flowing through the circuit of Embodiment 5 and $V_{GS}$.

The current flowing through each transistor is depicted in FIG. 7. As shown in FIG. 7, until $V_{out}$ approaches a value which is nearer to that of $V_{in}$, the transistors $N_2$ or $P_2$, which have large current driving abilities, are placed in ON states, so that it is possible to realize a further increase in speed in comparison with the case of Embodiment 4 shown in FIG. 5.

(Embodiment 6)

Figure 8:
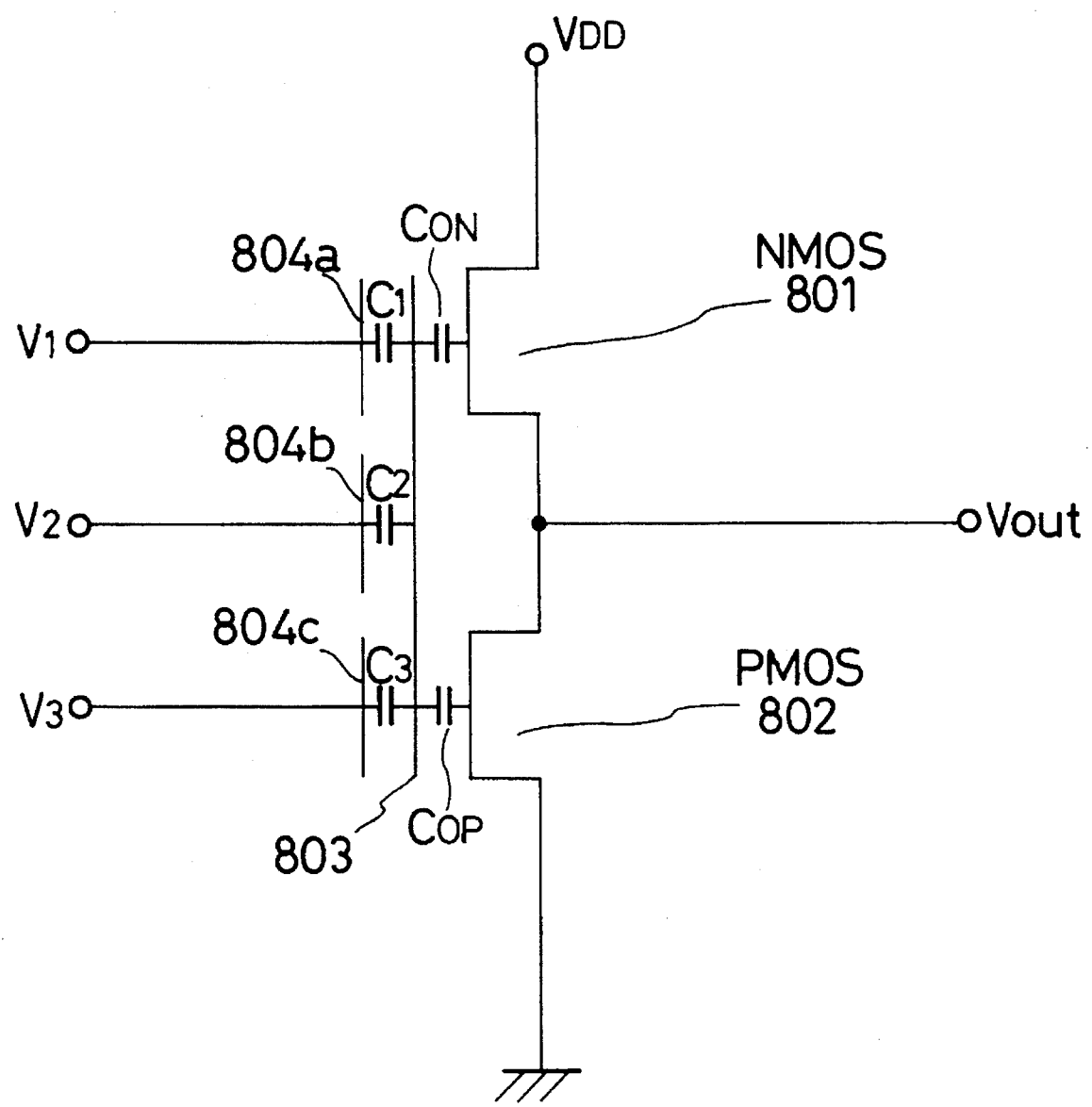
FIG. 8 is a conceptual diagram showing the circuit of Embodiment 6.

A sixth Embodiment is depicted in FIG. 8. In the present Embodiment, a floating gate 803 is used as the gate electrode of the first Embodiment and this is provided along with control electrodes 804a, 804b, and 804c which conduct capacitive coupling. If the input voltages into each control electrode are termed $V_1$, $V_2$, and $V_3$, then the potential $\phi_F$ of floating gate 803 is such that $$\phi_F = \frac{C_1V_1 + C_2V_2 + C_3V_3 + Q_F}{C_{TOT}} \quad (12)$$

Here, $$C_{TOT}=C_1+C_2+C_3+C_{OP}+C_{ON}$$

$C_1$–$C_3$: capacitive coupling between control electrodes and the floating gate $C_{OP}$, $C_{ON}$: capacitive coupling coefficients between floating gates of the PMOS and NMOS portions and the substrate $Q_F$: total amount of the charge within the floating gate. For example, if $\beta_R=1$, and $|V_{TN}|=V_{TP}$ are designated, then $$V_{out}=\phi_F=w_1V_1+w_2V_2+w_3V_3+Q_F/C_{TOT},$$

and $$w_i=C_i/C_{TOT}$$

results, Here, if $Q_F=0$, then $$V_{out}=w_1V_1+w_2V_2+w_3V_3$$

results, and it is possible to realize a circuit in which the linear sum of the input voltages is calculated.

Furthermore, by designating $Q_F \neq 0$, it is also possible to add an offset. In order to change $Q_F$, it is acceptable to impress high voltages on $V_1$, $V_2$, and $V_3$, to inject electrons passing through the gate oxide film or to discharge these.

Furthermore, if the capacitances of each capacitor in FIG. 8 are set so that $C_2=2C_1$, $C_3=2^2C_1$ (that is to say, $w_2=2w_1$, and $w_3=2^2w_1$), and the input voltages $V_1$, $V_2$, and $V_3$ are set so as to be two-value signals such that $V_i=X_iV_{DD}$ ($X=1$ or 0), then $V_{out}$ is such that $$V_{out}=w_1V_{DD}(X_1+2X_2+2^2X_3),$$

and a circuit which conducts the D/A conversion of 3-bit binary numbers is realized. In the same manner, it is possible to easily create an n-bit D/A conversion circuit.

Figure 9:
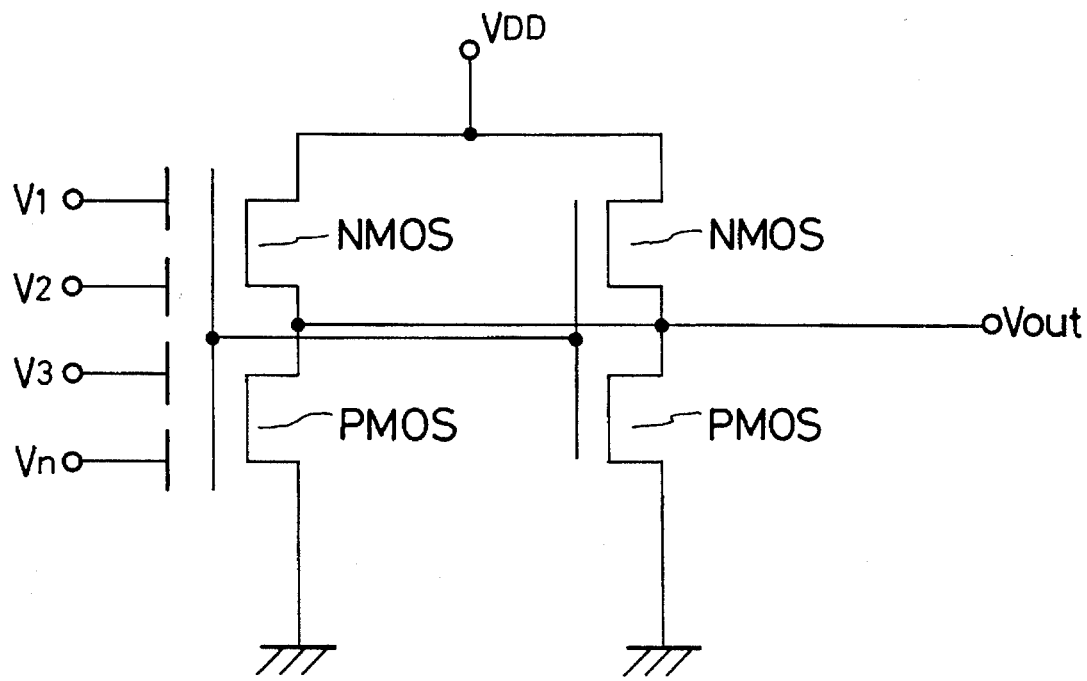
FIG. 9 is a conceptual diagram showing another circuit of Embodiment 6.
Figure 10:
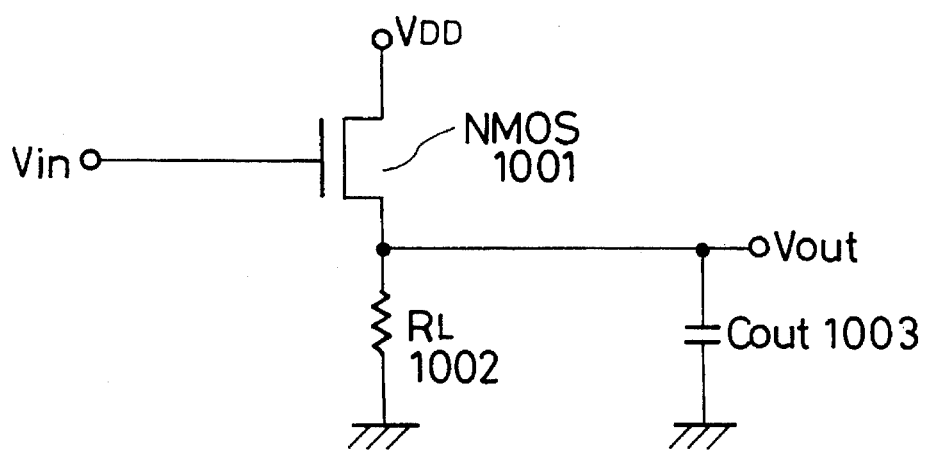
FIG. 10 is a conceptual diagram showing a conventional source follower circuit.
Figure 11:
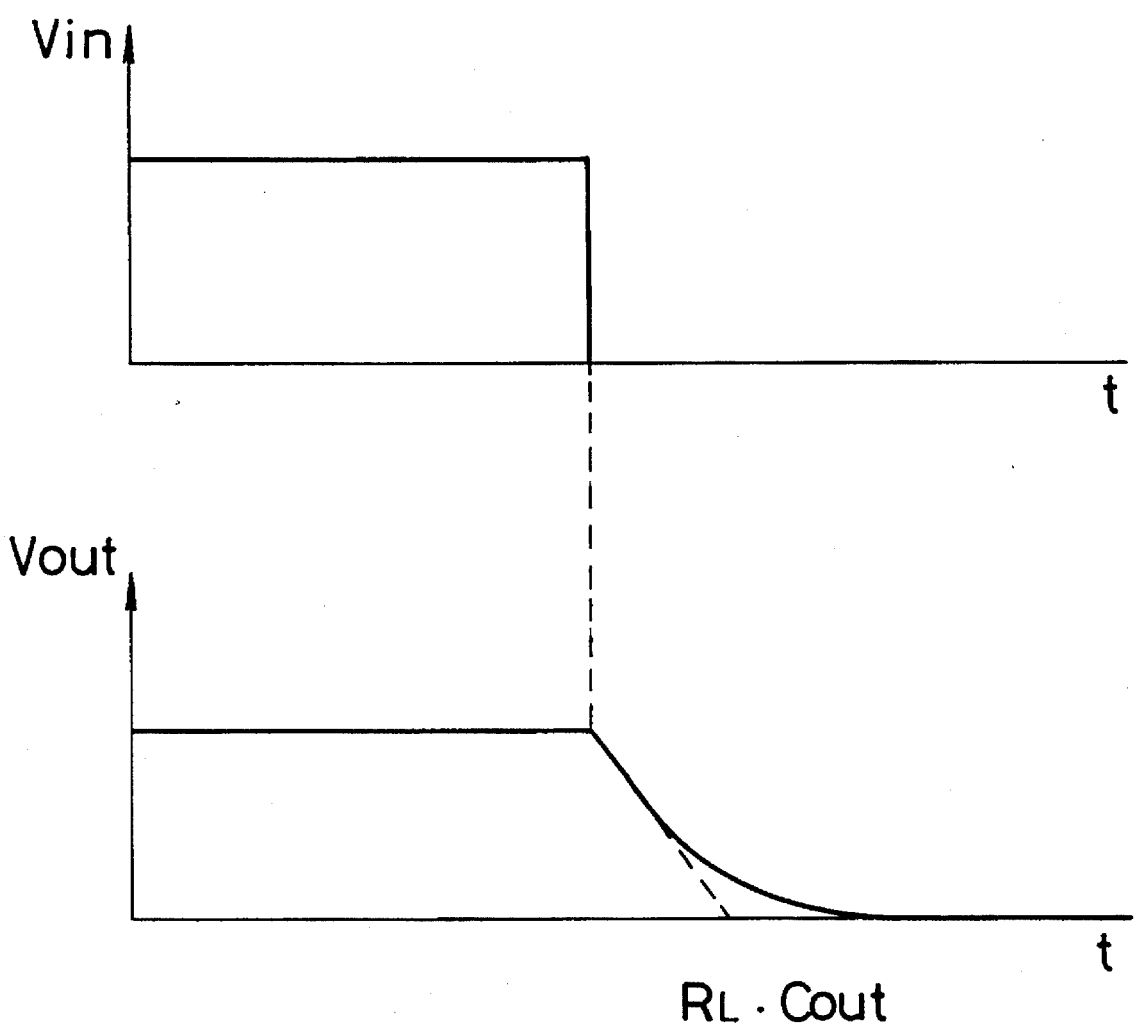
FIG. 11 is a graph showing the response characteristics of output voltage in a conventional source follower circuit.

Furthermore, by adding a circuit having a large current driving ability to the circuit shown in FIG. 8, as shown in FIG. 9, in a manner identical to that of Embodiment 4, it is possible to achieve a further increase in circuit speed.

INDUSTRIAL APPLICABILITY

By means of the present invention, it is possible to realize a source-follower circuit having a voltage gain which is essentially equal to 1, and to realize a circuit capable of limiting the consumption power at the time of the maintenance of a fixed potential to essentially 0, and which is capable of responding extremely rapidly to changes in potential.

What is claimed is:

1. A source follower circuit comprising:

a first NMOS transistor having a first source, a first drain, and a first floating gate;

a second NMOS transistor having a second source, a second drain, and a second floating gate;

a first PMOS transistor having a third source, a third drain, and a third floating gate;

a second PMOS transistor having a fourth source, a fourth drain, and a fourth floating gate;

said first, second, third, and fourth sources connected together and to an output terminal;

said first and second drains connected together;

said third and fourth drains connected together;

said first, second, third, and fourth floating gates connected together; and a plurality of input gates respectively connected to a plurality of input terminals and capacitively coupled to one or more of said floating gates;

the threshold voltages of said first, second, third, and fourth transistors selected so that they comply with one of $$V_{TN2}>V_{TP1}>V_{TN1}>V_{TP2} \text{ and}$$

$$V_{TP1}>V_{TN2}>V_{TP2}>V_{TN1}$$

wherein $V_{TN1}$ is a threshold voltage of said first NMOS transistor;

$V_{TN2}$ is the threshold voltage of said second NMOS transistor;

$V_{TP1}$ is a threshold voltage of said first PMOS transistor; and $V_{TP2}$ is the threshold voltage of said second PMOS transistor.

2. A source follower circuit comprising:
 a first NMOS transistor having a first source, a first drain, and a first gate;
 a second NMOS transistor having a second source, a second drain, and a second gate;
 a first PMOS transistor having a third source, a third drain, and a third gate;
 a second PMOS transistor having a fourth source, a fourth drain, and a fourth gate;
 said first, second, third, and fourth sources connected together and to an output terminal;
 said first and second drains connected together;
 said third and fourth drains connected together;
 said first, second, third, and fourth gates connected together and to an input terminal; and
 the threshold voltages of said first, second, third, and fourth transistors selected so that they comply with one of $V_{TN2} > V_{TP1} > V_{TN1} > V_{TP2}$ and $V_{TP1} > V_{TN2} > V_{TP2} > V_{TN1}$ wherein $V_{TN1}$ is a threshold voltage of said first NMOS transistor;

$V_{TN2}$ is the threshold voltage of said second NMOS transistor;

$V_{TP1}$ is a threshold voltage of said first PMOS transistor; and $V_{TP2}$ is the threshold voltage of said second PMOS transistor.

* * * * *